United States Patent
Cui (10) Patent No.: US 11,968,859 B2
(45) Date of Patent: Apr. 23, 2024

(54) ARRAY SUBSTRATE AND METHOD FOR MANUFACTURING THE SAME, DISPLAY PANEL AND DISPLAY DEVICE

(71) Applicant: BOE TECHNOLOGY GROUP CO., LTD., Beijing (CN)

(72) Inventor: Ying Cui, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 221 days.

(21) Appl. No.: 17/501,332

(22) Filed: Oct. 14, 2021

(65) Prior Publication Data

US 2022/0123077 A1 Apr. 21, 2022

(30) Foreign Application Priority Data

Oct. 15, 2020 (CN) .......................... 202011101909.8

(51) Int. Cl.
| | |
|---|---|
| H01L 27/32 | (2006.01) |
| H01L 51/52 | (2006.01) |
| H01L 51/56 | (2006.01) |
| H10K 50/84 | (2023.01) |
| H10K 59/122 | (2023.01) |
| H10K 71/00 | (2023.01) |
| H10K 59/12 | (2023.01) |
| H10K 59/35 | (2023.01) |
| H10K 59/80 | (2023.01) |
| H10K 102/00 | (2023.01) |

(52) U.S. Cl.
CPC .......... *H10K 59/122* (2023.02); *H10K 50/84* (2023.02); *H10K 71/00* (2023.02); *H10K 59/1201* (2023.02); *H10K 59/35* (2023.02); *H10K 59/873* (2023.02); *H10K 2102/351* (2023.02)

(58) Field of Classification Search
CPC ..................................................... H10K 59/122
See application file for complete search history.

(56) References Cited

U.S. PATENT DOCUMENTS

| | | | |
|---|---|---|---|
| 11,903,260 B2* | 2/2024 | Bing | H10K 59/122 |
| 2020/0185470 A1* | 6/2020 | Son | H10K 59/123 |
| 2020/0212128 A1* | 7/2020 | Son | H10K 59/122 |

* cited by examiner

*Primary Examiner* — Victoria K. Hall
(74) *Attorney, Agent, or Firm* — Dority & Manning, P.A.

(57) ABSTRACT

An array substrate includes a base and a pixel defining layer and light-emitting layers that are disposed on the base. The pixel defining layer includes defining strips extending in a first direction and defining portions extending in a second direction, the defining strips and the defining portions define openings, defining portions located between two adjacent defining strips are spaced apart in the first direction, a defining portion includes at least two second sub-portions and first sub-portion(s) connected to the two adjacent defining strips through the at least two second sub-portions, thickness of a defining strip is greater than a thickness of a first sub-portion, and the thickness of the first sub-portion is greater than a thickness of a second sub-portion. Portion(s) of a light-emitting layer is disposed in a corresponding opening, and at least two light-emitting layers between the two adjacent defining strips are connected to form a one-piece structure.

15 Claims, 10 Drawing Sheets

ARRAY SUBSTRATE AND METHOD FOR MANUFACTURING THE SAME, DISPLAY PANEL AND DISPLAY DEVICE

CROSS-REFERENCE TO RELATED APPLICATION

This application claims priority to Chinese Patent Application No. 202011101909.8, filed on Oct. 15, 2020, which is incorporated herein by reference in its entirety.

TECHNICAL FIELD

The present disclosure relates to the field of display technologies, and in particular to an array substrate and a method for manufacturing the same, a display panel and a display device.

BACKGROUND

Organic light-emitting diode (OLED) substrates have been gradually applied to electronic devices such as mobile phones, TVs, watches due to their characteristics of lightness and thinness, bright colors, flexibility, etc.

SUMMARY

In an aspect, an array substrate is provided. The array substrate includes: a base, a pixel defining layer disposed on a side of the base, and a plurality of light-emitting layers disposed on the side of the base. The pixel defining layer includes a plurality of defining strips extending in a first direction and a plurality of defining portions extending in a second direction, and the first direction intersects with the second direction; any two adjacent defining strips are provided with defining portions in the plurality of defining portions therebetween, the defining portions located between the two adjacent defining strips are spaced apart in the first direction; and the plurality of defining strips and the plurality of defining portions define a plurality of openings; and a defining portion includes at least one first sub-portion and at least two second sub-portions, the at least one first sub-portion is connected to the two adjacent defining strips through the at least two second sub-portions, a thickness of a defining strip is greater than a thickness of a first sub-portion, and the thickness of the first sub-portion is greater than a thickness of a second sub-portion. At least one portion of a light-emitting layer is disposed in a corresponding opening, and at least two light-emitting layers located between the two adjacent defining strips are connected to form a one-piece structure.

In some embodiments, the thickness of the second sub-portion is in a range from 5% to 10% of the thickness of the first sub-portion.

In some embodiments, the thickness of the first sub-portion is in a range from 10% to 30% of the thickness of the defining strip.

In some embodiments, in the second direction, a width of the first sub-portion is greater than a width of the defining strip.

In some embodiments, in the second direction, the width of the first sub-portion is greater than a width of the second sub-portion.

In some embodiments, the width of the defining strip is greater than the width of the second sub-portion.

In some embodiments, the width of the defining strip is in a range from 10% to 30% of the width of the first sub-portion.

In some embodiments, the width of the second sub-portion is in a range from 5% to 10% of the width of the first sub-portion.

In some embodiments, the defining portion includes one first sub-portion and two second sub-portions, and the two second sub-portions are located on two opposite sides of the first sub-portion in the second direction.

In some embodiments, all light-emitting layers located between the two adjacent defining strips are connected to form a one-piece structure.

In some embodiments, the plurality of light-emitting layers are divided into a plurality of groups; and each group includes at least three light-emitting layers sequentially arranged in the second direction, and colors of light emitted by the at least three light-emitting layers are different.

In some embodiments, the array substrate further includes a plurality of first electrodes disposed on a side, approximate to the base, of the plurality of light-emitting layers. An orthogonal projection of an opening on the base is within an orthogonal projection of a corresponding first electrode on the base.

In some embodiments, the array substrate further includes a second electrode disposed on a side of the plurality of light-emitting layers away from the base.

In some embodiments, the array substrate further includes a light-emitting functional layer disposed in the corresponding opening. The light-emitting functional layer includes at least one of a hole injection layer, a hole transport layer, an electron blocking layer, an electron injection layer, an electron transport layer or a hole blocking layer.

In some embodiments, the array substrate further includes an encapsulation layer disposed on a side of the plurality of light-emitting layers away from the base.

In another aspect, a display panel is provided. The display panel includes the array substrate as described in any of the above embodiments.

In yet another aspect, a display device is provided. The display device includes the display panel as described in the above embodiment.

In yet another aspect, a method for manufacturing an array substrate is provided. The method includes: forming a pixel defining film on a base; patterning the pixel defining film to form a pixel defining layer; and forming a plurality of light-emitting layers, by using an inkjet printing process, on the base on which the pixel defining layer has been formed. The pixel defining layer includes a plurality of defining strips extending in a first direction and a plurality of defining portions extending in a second direction, and the first direction intersects with the second direction; any two adjacent defining strips are provided with defining portions in the plurality of defining portions therebetween, the defining portions located between the two adjacent defining strips are spaced apart in the first direction, and a defining portion includes at least one first sub-portion and at least two second sub-portions, the at least one first sub-portion is connected to the two adjacent defining strips through the at least two second sub-portions, a thickness of a defining strip is greater than a thickness of a first sub-portion, and the thickness of the first sub-portion is greater than a thickness of a second sub-portion. At least one portion of a light-emitting layer is disposed in a corresponding opening, and at least two light-emitting layers located between the two adjacent defining strips are connected to form a one-piece structure.

In some embodiments, patterning the pixel defining film to form the pixel defining layer, includes: providing a mask; exposing the pixel defining film by using the mask; and developing the pixel defining film to form the pixel defining layer. The mask includes first portions corresponding to the plurality of defining strips to be formed, second portions corresponding to first sub-portions to be formed, and third portions corresponding to second sub-portions to be formed. A transmittance of the first portions is 0, a transmittance of the second portions is greater than the transmittance of the first portions, a transmittance of the third portions is greater than the transmittance of the second portions, and the transmittance of the third portions is less than 100%; or a transmittance of the first portions is 100%, a transmittance of the second portions is less than the transmittance of the first portions, a transmittance of the third portions is less than the transmittance of the second portions, and the transmittance of the third portions is greater than 0.

In some embodiments, the method further includes: forming a plurality of first electrodes on the base before the pixel defining layer is formed; and forming a second electrode on the base on which the plurality of light-emitting layers have been formed.

BRIEF DESCRIPTION OF THE DRAWINGS

In order to describe technical solutions in embodiments of the present disclosure more clearly, accompanying drawings to be used in some embodiments of the present disclosure will be introduced briefly. However, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products and actual processes of methods involved in the embodiments of the present disclosure.

DETAILED DESCRIPTION

Technical solutions in some embodiments of the present disclosure will be described clearly and completely below with reference to the accompanying drawings. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

As used herein, "on", "formed on" and "disposed on" may mean that one layer is formed or disposed directly on another layer, or that one layer is formed or disposed indirectly on another layer (that is, there are other layer(s) between the two layers).

Unless otherwise specified, the term "located on the same layer" used herein means that two layers, components, members, elements or portions may be formed by the same patterning process, and the two layers, components, members, elements or portions are generally formed of the same material. The expression "patterning process" generally includes the steps of coating, exposing, developing, etching and stripping photoresist. The expression "a single patterning process" means a process of forming patterned layer(s), component(s), member(s), etc., by using a signal mask.

In the description of some embodiments, the term "connected" and derivatives thereof may be used. For example, the term "connected" may be used in the description of some embodiments to indicate that two or more components are in direct physical or electrical contact with each other. The embodiments disclosed herein are not necessarily limited to the content herein.

The phrase "at least one of A, B and C" has the same meaning as the phrase "at least one of A, B or C", and they both include the following combinations of A, B and C only A, only B, only C, a combination of A and B, a combination of A and C, a combination of B and C, and a combination of A, B and C.

The phrase "A and/or B" includes the following three combinations: only A, only B, and a combination of A and B.

"A is disposed on a side of B away from C" may mean that A is formed later than B.

In addition, the use of the phrase "based on" is meant to be open and inclusive, since a process, step, calculation or other action that is "based on" one or more of the stated conditions or values may be based on additional conditions or values exceeding those stated in practice.

Exemplary embodiments are described herein with reference to sectional views and/or plan views as idealized exemplary drawings. In the accompanying drawings, thicknesses of layers and sizes of regions are enlarged for clarity. Variations in shape with respect to the drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a curved feature. Therefore, the regions shown in the accompanying drawings are schematic in nature, and their shapes are not intended to show actual shapes of the region in a device, and are not intended to limit the scope of the exemplary embodiments.

As shown in FIGS. 1 to 5, some embodiments of the present disclosure provide an array substrate 100, and the array substrate 100 includes a base 1, a pixel defining layer 2 disposed on a side of the base 1 and a plurality of light-emitting layers 3 disposed on the side of the base 1.

Figure 1:
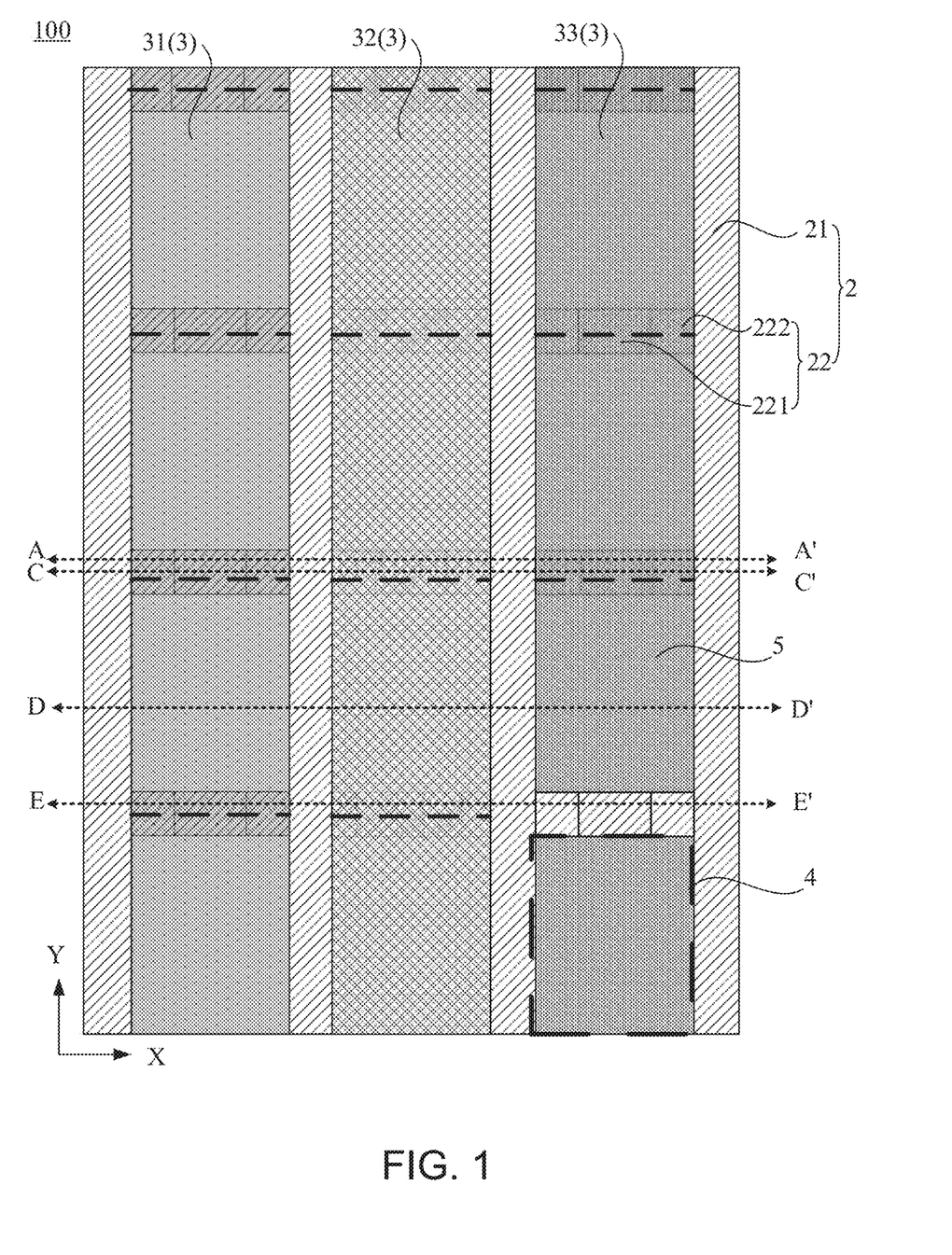
FIG. 1 is a structural diagram of an array substrate, in accordance with some embodiments of the present disclosure.

For example, the base 1 is a rigid base, such as a glass base. For another example, the base 1 is a flexible base, such as a polyethylene terephthalate (PET) base, a polyethylene naphthalate two formic acid glycol ester (PEN) base, or a polyimide (PI) base.

Figure 2:
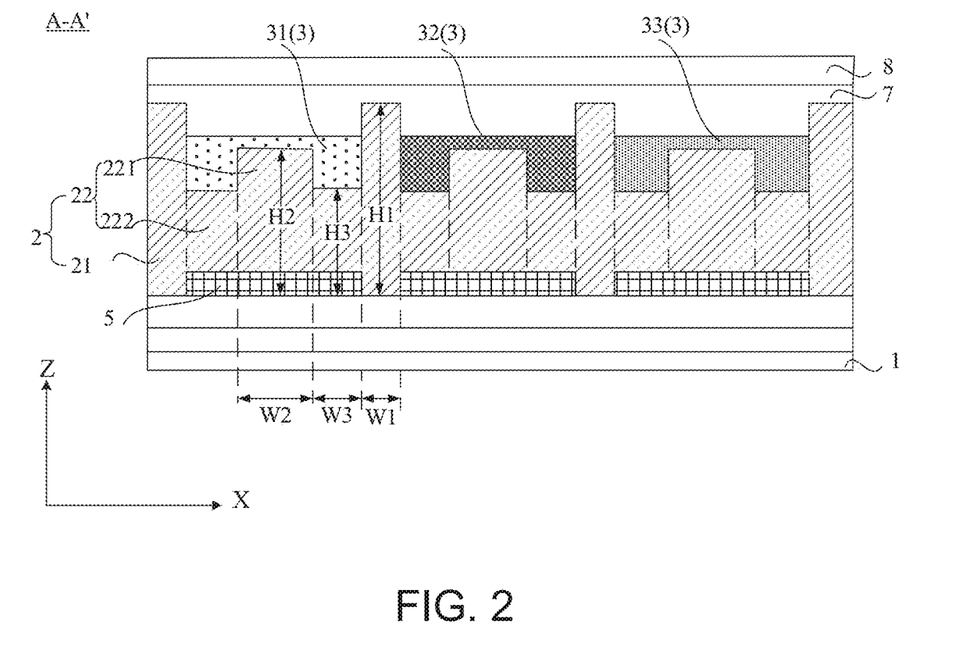
FIG. 2 is a sectional view of the array substrate shown in FIG. 1 taken along the line A-A'.
Figure 4:
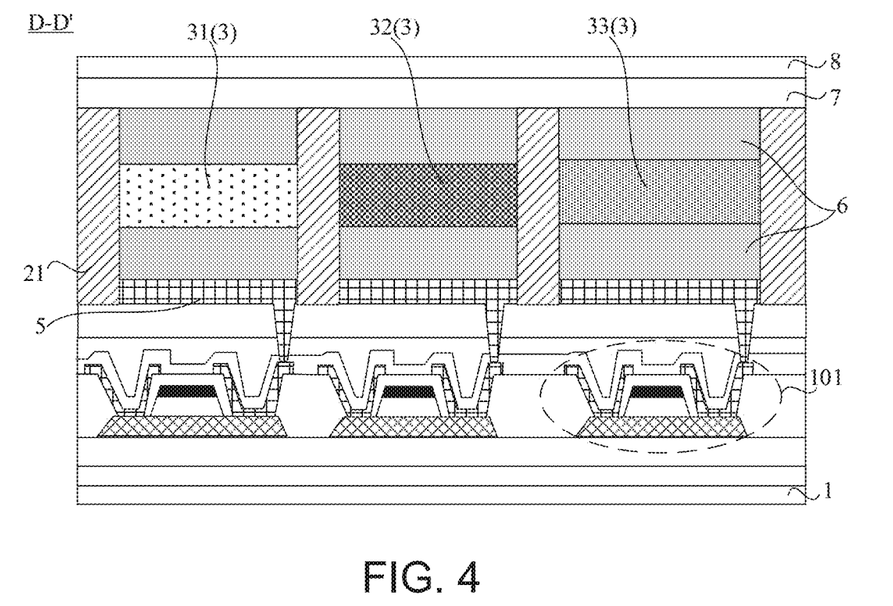
FIG. 4 is a sectional view of the array substrate shown in FIG. 1 taken along the line D-D'.

In some examples, as shown in FIGS. 1, 2 and 4, the array substrate 100 further includes a plurality of first electrodes 5 disposed on a side of the plurality of light-emitting layers 3 proximate to the base 1. The plurality of first electrodes 5 may be arranged in an array.

The pixel defining layer 2 is disposed on a side of the plurality of first electrodes 5 away from the base 1. Based on this, in a process of fabricating the pixel defining layer 2 and the first electrodes 5, the first electrodes 5 may be fabricated first, and the pixel defining layer 2 is fabricated later.

In some examples, as shown in FIG. 1, the pixel defining layer 2 includes a plurality of defining strips 21 extending in a first direction Y and a plurality of defining portions 22 extending in a second direction X. Any two adjacent defining strips 21 are provided with defining portions 22 in the plurality of defining portions 22 therebetween, and the defining portions 22 located between the two adjacent defining strips 21 are spaced apart in the first direction Y. The plurality of defining strips 21 and the plurality of defining portions 22 define a plurality of openings 4. That is, the plurality of defining portions 22 are arranged in rows of defining portions 22 in the first direction Y, defining portions 22 in each row are spaced apart in the second direction X, and the plurality of defining strips 21 and the plurality of defining portions 22 form a grid structure. Two adjacent defining strips 21 and two adjacent defining portions 22 located therebetween enclose one opening 4.

The first direction Y and the second direction X intersect. An included angle between the first direction Y and the second direction X can be set according to actual needs. For example, the included angle between the first direction Y and the second direction X is 80°, 90°, 100° or 110°. For convenience of description, the embodiments of present disclosure is described by taking an example in which the first direction Y and the second direction X are perpendicular to each other (that is, the included angle therebetween is 90°).

As shown in FIG. 1, defining portions 22 located on two sides of a defining strip 21 are connected to the defining strip 21.

For example, orthogonal projections of two adjacent defining portions 22 located on two sides of the defining strip 21 on a plane perpendicular to the second direction X are completely overlapped. For another example, the orthogonal projections of the two adjacent defining portions 22 located on two sides of the defining strip 21 on the plane are partially overlapped. The arrangement of the plurality of defining portions 22 is various, which may be selected according to actual needs.

In some examples, as shown in FIGS. 1 and 4, an opening 4 corresponds to one first electrode 5. At least one portion of the first electrode 5 is exposed by the opening 4.

That is, an orthogonal projection of the opening 4 on the base 1 is within an orthogonal projection of the corresponding first electrode 5 on the base 1. In this case, the orthogonal projection of the opening 4 on the base 1 may coincide with the orthogonal projection of the corresponding first electrode 5 on the base 1; or an area of the orthogonal projection of the opening 4 on the base 1 may be less than an area of the orthogonal projection of the corresponding first electrode 5 on the base 1.

A shape of the orthogonal projection of the opening 4 on the base 1 is not limited herein. For example, the shape of the orthogonal projection of the opening 4 on the base 1 is rectangular or circular. In addition, a shape of the orthogonal projection of the defining strip 21 on the base 1 is not necessarily limited to a strip shape shown in FIG. 1. The orthogonal projection of defining strip 21 may also be in a shape of a broken line or a wavy line.

For example, the pixel defining layer 2 is fabricated before the plurality of light-emitting layers 3.

Each light-emitting layer 3 corresponds to one opening 4. In some examples, as shown in FIG. 1, at least one portion of the light-emitting layer 3 is disposed in the corresponding opening 4.

For example, an entire light-emitting layer 3 is disposed in the corresponding opening 4.

For example, a portion of the light-emitting layer 3 is disposed in the corresponding opening 4, and another portion of the light-emitting layer 3 is disposed on the pixel defining layer 2 (e.g., the defining portion (s) 22).

In some examples, as shown in FIG. 4, the array substrate 100 further includes a light-emitting functional layer 6 disposed in the opening 4.

The light-emitting functional layer 6 may include at least one of a hole injection layer, a hole transport layer, an electron blocking layer, an electron injection layer, an electron transport layer or a hole blocking layer. For example, the light-emitting functional layer 6 includes the hole transport layer and the electron transport layer. The hole transport layer is located between the light-emitting layer 3 and the first electrode 5, and the electron transport layer is located on a side of the light-emitting layer 3 away from the first electrode 5. For another example, the light-emitting functional layer 6 includes the hole injection layer, the hole transport layer, the electron injection layer, and the electron transport layer. The hole injection layer is located between the hole transport layer and the first electrode 5, the hole transport layer is located on a side of the light-emitting layer 3 proximate to the first electrode 5, the electron injection layer is located on a side of the light-emitting layer 3 away from the first electrode 5, and the electron transport layer is located between the electron injection layer and the light-emitting layer 3. For yet another example, the light-emitting functional layer 6 includes the hole injection layer, the hole transport layer, the hole blocking layer, the electron injection layer, the electron transport layer, and the electron blocking layer. The hole injection layer is located between the hole transport layer and the first electrode 5, and the hole transport layer is located on a side of the light-emitting layer 3 proximate to the first electrode 5. The electron injection layer is located on a side of the light-emitting layer 3 away from the first electrode 5, and the electron transport layer is located between the electron injection layer and the light-emitting layer 3. The hole blocking layer is located between the electron transport layer and the light-emitting layer 3, and the electron blocking layer is located between the hole transport layer and the light-emitting layer 3.

In some examples, as shown in FIGS. 2 to 5, the array substrate 100 further includes at least one second electrode 7 disposed on a side of the plurality of light-emitting layers 3 away from the base 1.

For example, there is one second electrode 7, and the second electrode 7 may be a planar electrode. The planar electrode may cover the pixel defining layer 2. The planar electrode may be made of aluminum or the like.

For example, the first electrode 5 is an anode, the second electrode 7 is a cathode. For another example, the first electrode 5 is the cathode, the second electrode 7 is the anode.

In the embodiments of the present disclosure, the array substrate 100 is described by taking an example in which the first electrode 5 is the anode and the second electrode 7 is the cathode.

In some embodiments, as shown in FIGS. 2 to 5, the array substrate 100 may further include an encapsulation layer 8 disposed on the side of the plurality of light-emitting layers 3 away from the base 1. The encapsulation layer 8 is located on a side of the second electrode 7 away from the base 1 and covers the second electrode 7.

The encapsulation layer 8 may be a thin film encapsulation layer.

The encapsulation layer 8 is configured to encapsulate the light-emitting layer 3 and the light-emitting functional layer 6, so as to isolate the light-emitting layer 3 and the light-emitting functional layer 6 from corrosion by external moisture, oxygen, etc., thereby improving a life of the array substrate 100.

In some examples, as shown in FIG. 2, a thickness H1 of the defining strip 21 is greater than a thickness of the defining portion 22. That is, in a thickness direction Z of the base 1, a height of the defining strip 21 is greater than a height of the defining portion 22.

Therefore, in a process of forming the light-emitting layer 3 by using an inkjet printing process, since the defining strip 21 is relatively high, ink may be prevented from passing over two adjacent defining strips 21 and entering openings 4 that are located between other defining strips 21. In this case, inks in adjacent regions defined by three or four adjacent defining strips 21 are not mixed, thereby preventing color mixture of light emitted by light-emitting layers 3 in the adjacent regions, and avoiding affecting a purity of light color.

In some examples, at least two light-emitting layers 3, located between the two adjacent defining strips 21, are connected to form a one-piece structure, and light emitted by the at least two connected light-emitting layers 3 have the same color. The embodiments of the present disclosure do not limit the color of light emitted by unconnected light-emitting layers 3 located between the two adjacent defining strips 21.

Light-emitting layers 3 located between the two adjacent defining strips 21 may be arranged in various manners. For example, two or more adjacent light-emitting layers 3 located between the two adjacent defining strips 21 are connected to form a one-piece structure. In this case, the two or three adjacent light-emitting layers 3 located between the two adjacent defining strips 21 are made of the same material. For another example, all the light-emitting layers 3 located between the two adjacent defining strips 21 are connected to form a one-piece structure. In this case, all the connected light-emitting layers 3 located between the two adjacent defining strips 21 are made of the same material.

In the embodiments of the present disclosure, since the height of the defining strip 21 is greater than the height of the defining portion 22, ink in adjacent openings 4 between two adjacent defining strips 21 may flow freely through the defining portion 22 in the process of forming light-emitting layers located between the two adjacent defining strips 21 by using the inkjet printing process, and light-emitting layers 3 in the adjacent openings 4 are connected to each other. In this way, difference in the amount of ink in the adjacent openings 4 may be reduced, and the amount of ink in the adjacent openings 4 tends to be the same, thereby reducing difference in the thicknesses of the light-emitting layers 3 in the adjacent openings 4, improving the film formation uniformity of an edge, close to the defining portion 22, of the light-emitting layer 3, and further improving the film formation uniformity of the light-emitting layers 3.

For the connected light-emitting layers 3, each light-emitting layer 3 includes a portion located in the opening 4 and two other portions located on the defining portions 22 that are located on two sides of the opening 4, and the portions located in two adjacent openings 4 are connected through the portion located on the defining portion 22.

In some examples, as shown in FIGS. 1, 2, 3, and 5, the defining portion 22 includes at least one first sub-portion 221 and at least two second sub-portion 222 arranged in the second direction X, and the at least one first sub-portion 221 is connected to two adjacent defining strips 21 through the at least two second sub-portions 222. The thickness H1 of the defining strip 21 is greater than a thickness H2 of the first sub-portion 221, and the thickness H2 of the first sub-portion 221 is greater than a thickness H3 of the second sub-portion 222. That is, in the thickness direction Z of the base 1, the height of the defining strip 21 is greater than a height of the first sub-portion 221, and the height of the first sub-portion 221 is greater than a height of the second sub-portion 222.

In this case, the thickness of the defining portion 22 refers to a maximum thickness of the defining portion 22, and the height of the defining portion 22 refers to a maximum height of the defining portion 22. That is, in a case where the defining portion 22 has different thicknesses, the thickness of the defining portion 22 refers to the maximum thickness of the defining portion 22, and the height of the defining portion 22 refers to the maximum height of the defining portion 22.

There is at least one second sub-portion 222 between each first sub-portion 221 and the defining strip 21, and the first sub-portion 221 is not directly connected to the defining strip 21. Two second sub-portions 222, close to the two adjacent defining strips 21 in the at least two second sub-portions 222, are directly connected to the two adjacent defining strips 21.

Figure 3:
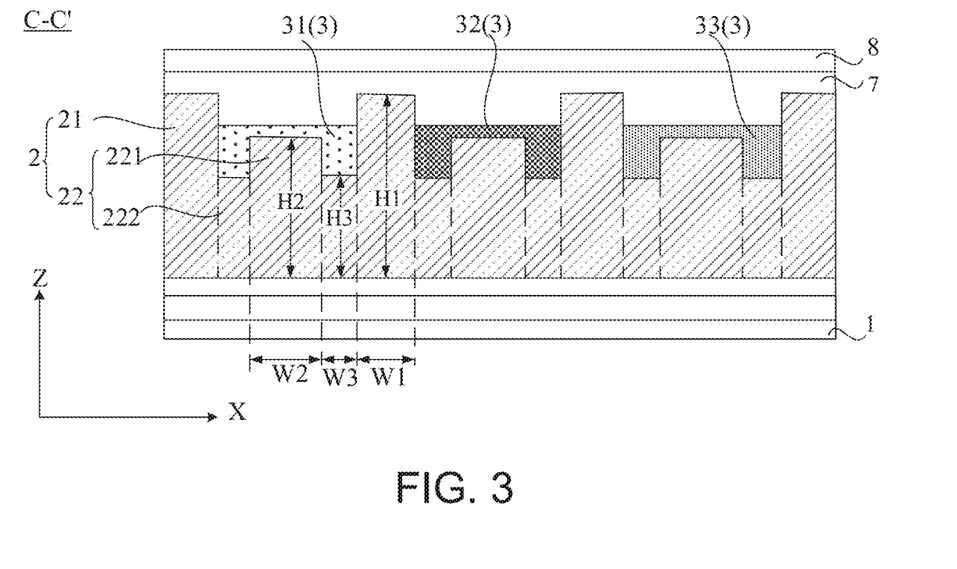
FIG. 3 is a sectional view of the array substrate shown in FIG. 1 taken along the line C-C'.

In some examples, as shown in FIG. 3, the defining portion 22 includes one first sub-portion 221 and two second sub-portions 222. The two second sub-portions 222 are located on two opposite sides of the first sub-portion 21 in the second direction X, and are connected to the two adjacent defining strips 21.

With the above arrangement, the pixel defining layer 2 may be simple in structure and easy to manufacture.

Figure 5:
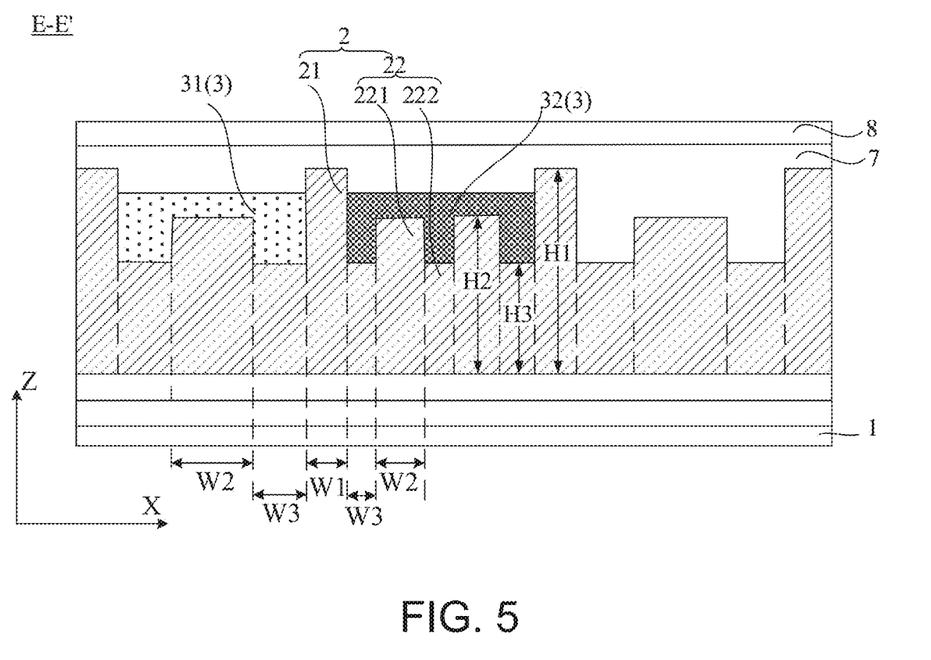
FIG. 5 is a sectional view of the array substrate shown in FIG. 1 taken along the line E-E.

In some other examples, as shown in FIG. 5, the defining portion 22 includes two first sub-portions 221 and three second sub-portions 222. The second sub-portions 222 and the first sub-portions 221 are alternately arranged in sequence in the second direction X. In this case, one second sub-portion 222 is located between the two first sub-portions 221, and the two first sub-portions 221 are connected to each other through the one second sub-portion 222; and each of remaining two second sub-portions 222 is located between the defining strip 21 and the first sub-portion 221 adjacent thereto, and the two first sub-portions 221 are connected to the two adjacent defining strips 21 through the two second sub-portions 222.

If thicknesses of the defining portion 22 and the defining strip 21 are equal or approximately equal (that is, thicknesses of the second sub-portion 222, the first sub-portion 221 and the defining strip 21 are equal or approximately equal), in a process of forming the plurality of light-emitting layers 3 by using inkjet printing, lyophobic substances in the defining strip 21 diffuse to the defining portion 22, so that a lyophilic property of the defining portion 22 is reduced. Therefore, fluidity of the ink on the defining portion 22 is poor, which is not conducive to uniformity of amounts of the ink in the two adjacent openings 4. As a result, thicknesses of the two adjacent light-emitting layers 3 are not uniform, thereby reducing the film formation uniformity of the plurality of light-emitting layers 3.

In the embodiments of the present disclosure, since two second sub-portions 222 in the at least two second sub-portions 222 with a smaller thickness are connected to the two adjacent defining strips 21, and the at least one first sub-portion 221 with a greater thickness is located between the two second sub-portions 222, when the lyophobic substances of the defining strip 21 diffuse to the defining portion 22, there is a high drop in a path through which the lyophobic substances of the defining strip 21 diffuse to the first sub-portion 221. In this way, it is difficult to diffuse the lyophobic substances to the first sub-portion 221. Therefore, lyophobic substances in the first sub-portion 221 are reduced, thereby improving the lyophilic property of the first sub-portion 221. In this case, when the plurality of light-emitting layers 3 are formed by using the inkjet printing, the fluidity of the ink on the first sub-portion 221 may be improved, difference of the amounts of ink between the two adjacent openings 4 located between the two adjacent defining strips 21 is reduced, and difference of thicknesses of the two adjacent light-emitting layers 3 is reduced, thereby improving the film formation uniformity of the plurality of light-emitting layers 3.

In addition, since the height of the defining strip 21 is greater than the height of the defining portion 22, it is possible to separate inks corresponding to light-emitting layers 3 with different light-emitting colors through the defining strip 21, so as to prevent different colored inks from being mixed, and further to improve the light-emitting purity of the light-emitting layers 3 with different light-emitting colors. Moreover, ink in adjacent openings 4 between the two adjacent defining strips 21 flows through the defining portion(s) 22, thereby reducing the difference of the amounts of ink in the adjacent openings, and further improving the film formation uniformity of the plurality of light-emitting layers 3.

In some embodiments, as shown in FIG. 2, the thickness H3 of the second sub-portion 222 is in a range from 5% to 10% of the thickness H2 of the first sub-portion 221. In some embodiments, as shown in FIG. 2, the thickness H2 of the first sub-portion 221 is in a range from 10% to 30% of the thickness H1 of the defining strip 21.

For example, the thickness H3 of the second sub-portion 222 is 5%, 6%, 7%, 8% or 10% of the thickness H2 of the first sub-portion 221, and the thickness H2 of the first sub-portion 221 is 10%, 15%, 20%, 25% or 30% of the thickness H1 of the defining strip 21.

For example, the thickness H1 of the defining strip 21 is in a range from 0.9 μm to 1.7 μm, such as 0.9 μm, 1.1 μm, 1.3 μm, 1.5 μm or 1.7 μm.

In this case, it is possible to cut off the path through which the lyophobic substances of the defining strip 21 diffuse to the first sub-portion 221, so as to avoid the increase of the lyophobic substances in the first sub-portion 221, thereby improving the lyophilic property of the first sub-portion 221, and further improving the lyophilic property of the defining portion 22.

In some embodiments, as shown in FIGS. 2, 3 and 5, in the second direction X, a width W2 of the first sub-portion 221 is greater than a width W1 of the defining strip 21. In some embodiments, as shown in FIGS. 2, 3 and 5, the width W2 of the first sub-portion 221 is greater than a width W3 of the second sub-portion 222.

It will be noted that, the width of the second sub-portion 222 and the width of the defining strip 21 in the second direction X are not limited here, which can be set according to actual needs. The width of the second sub-portion 222 and the width of the defining strip 21 may be equal or unequal.

In some examples, as shown in FIG. 3, the width W1 of the defining strip 21 is greater than the width W3 of the second sub-portion 222. In some other examples, as shown in FIG. 5, widths W3 of second sub-portions 222 in defining portions 22 are different, the width W1 of the defining strip 21 is greater than the width W3 of the second sub-portion 222 in a defining portion 22, and is less than the width W3 of the second sub-portion 222 in another defining portion 22.

For example, the width of the defining strip 21 is in a range from 10% to 30% of the width of the first sub-portion 221. For example, the width of the second sub-portion 222 is in a range from 5% to 10% of the width of the first sub-portion 221.

The width of the defining strip 21 may be 10%, 15%, 20%, 25% or 30% of the width of the first sub-portion 221, and the width of the second sub-portion 222 may be 5%, 6%, 7%, 8% or 10% of the width of the first sub-portion 221.

In this case, it is possible to increase stabilities of the pixel defining layer 2, thereby preventing the pixel defining layer 2 from collapsing.

Figure 6:
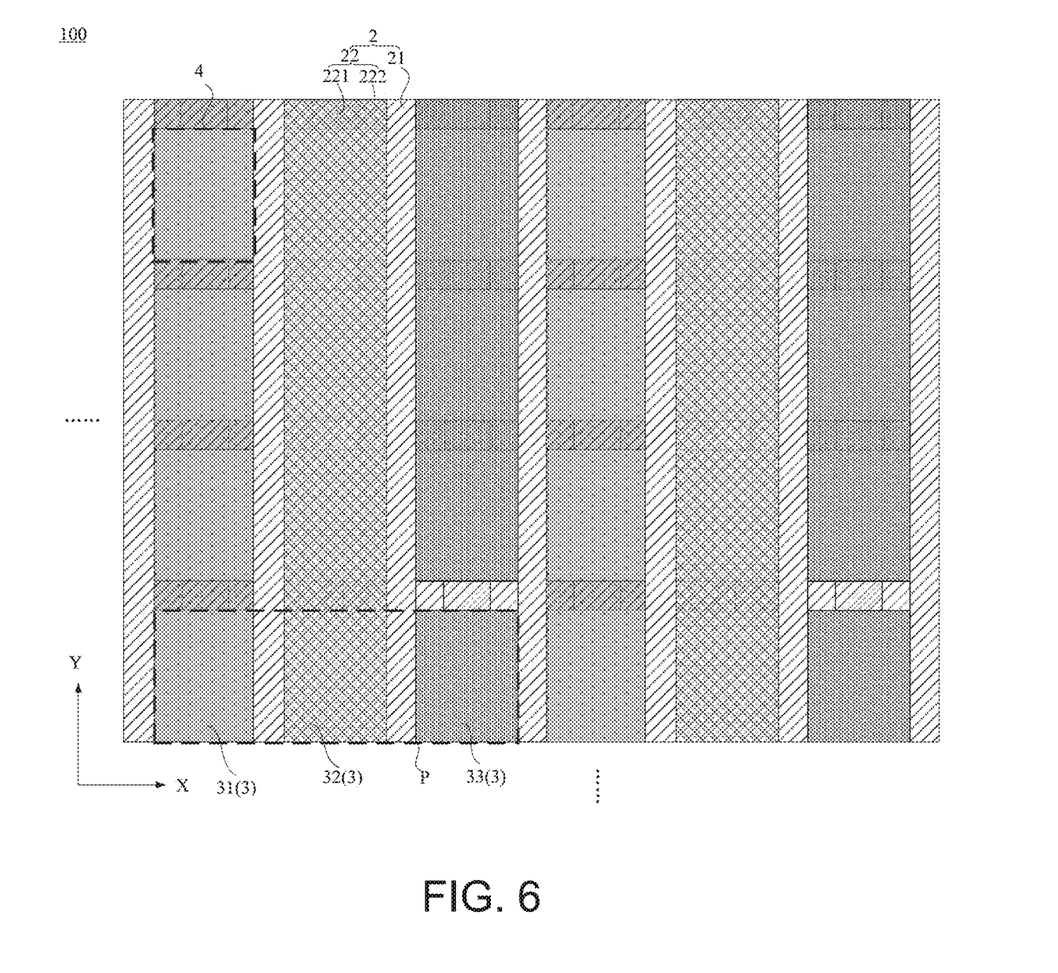
FIG. 6 is a structural diagram of another array substrate, in accordance with some embodiments of the present disclosure.

In some embodiments, as shown in FIG. 6, the plurality of light-emitting layers 3 are divided into a plurality of groups P, each group P includes at least three light-emitting layers 3 sequentially arranged in the second direction X, and colors of light emitted by the at least three light-emitting layers 3 are different.

In some examples, the group includes three light-emitting layers 3. For example, as shown in FIG. 6, the three light-emitting layers 3 in the group P includes a first light-emitting layer 31, a second light-emitting layer 32 and a third light-emitting layer 33. The first light-emitting layer 31 is configured to emit light of first color, the second light-emitting layer 32 is configured to emit light of second color, and the third light-emitting layer 33 is configured to emit light of third color. The first color, the second color and the third color are three primary colors.

For example, the first light-emitting layer 31 is a light-emitting layer emitting red light, the second light-emitting layer 32 is a light-emitting layer emitting green light, and the third light-emitting layer 33 is a light-emitting layer emitting blue light. Based on this, any two adjacent light-emitting layers in the second direction X have different light-emitting colors, and the first light-emitting layer, the second light-emitting layer and the third light-emitting layer are periodically arranged in the second direction X.

In some other examples, the group P includes four light-emitting layers 3.

For example, in addition to the first light-emitting layer, the second light-emitting layer and the third light-emitting layer, the group further includes a fourth light-emitting layer.

The fourth light-emitting layer may be a light-emitting layer emitting white light. The first light-emitting layer emitting the red light, the second light-emitting layer emitting the green light, the third light-emitting layer emitting the blue light, and the fourth light-emitting layer emitting the white light are periodically arranged in the second direction X.

It will be noted that, the type and number of the light-emitting layers included in the group in the embodiments of the present disclosure are not limited thereto, and other light-emitting layers may also be included in the group, which will be set according to actual needs. The light-emitting layers in the group may be disposed in one pixel, and each light-emitting layer in the group may be disposed in one sub-pixel in the pixel.

In some examples, as shown in FIG. 4, the array substrate 100 further includes a plurality of pixel circuits 101 disposed at sides of the plurality of first electrodes 5 proximate to the base 1. A pixel circuit 101 is electrically connected to a corresponding first electrode 5 and is configured to output a driving signal to the corresponding first electrode 5. In this case, when the second electrode 7 is applied with a power signal (e.g., a direct current voltage), the light-emitting layer 3 located between the first electrode 5 to which the driving signal is applied and the second electrode 7 emits light.

Figure 7:
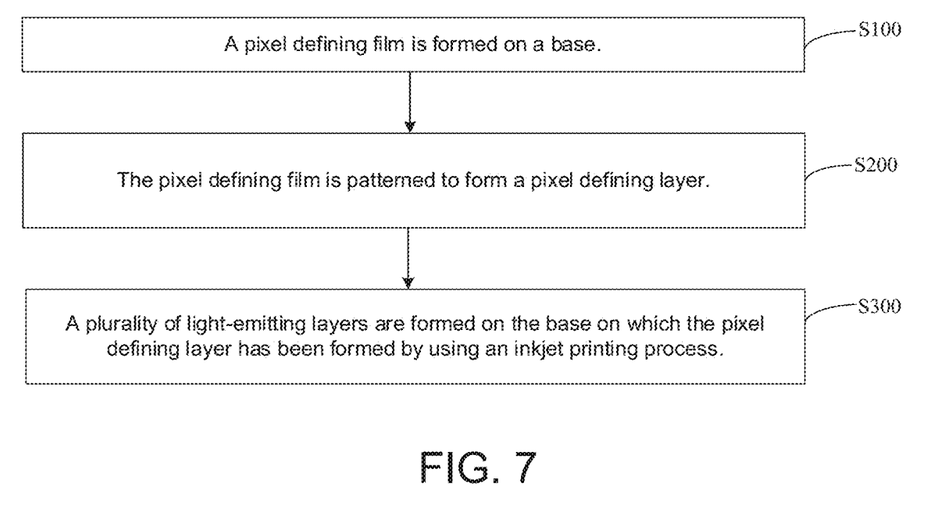
FIG. 7 is a flow chart of a method for manufacturing an array substrate, in accordance with some embodiments of the present disclosure.

Some embodiments of the present disclosure further provide a method for manufacturing an array substrate. Referring to FIG. 7, the method includes S100 to S300.

Figure 8A:
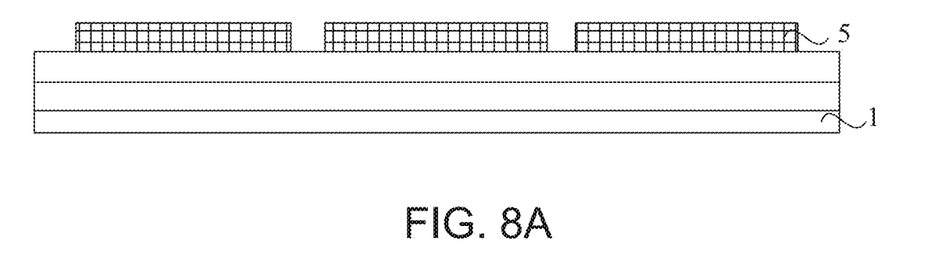
FIGS. 8A to 8G are schematic diagrams illustrating a process of manufacturing an array substrate, in accordance with some embodiments of the present disclosure.
Figure 8B:
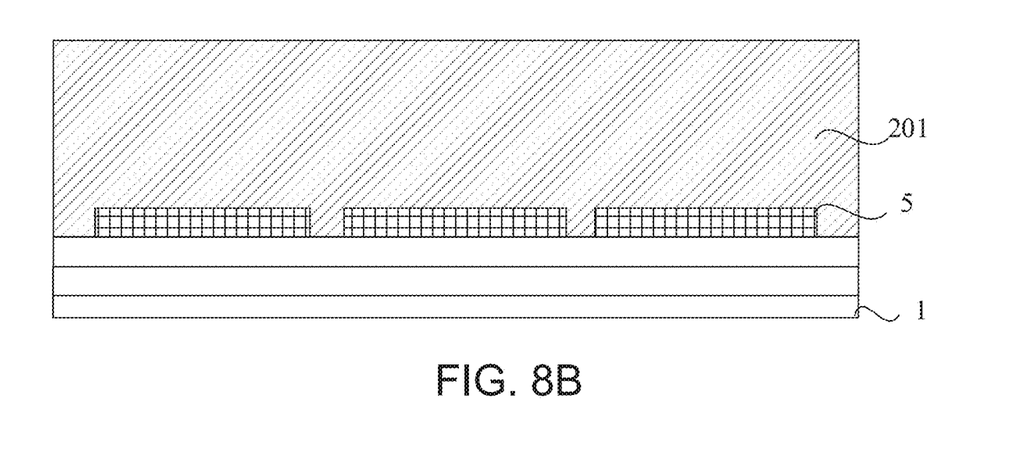

In S100, as shown in FIG. 8B, a pixel defining film 201 is formed on a base 1.

For example, as shown in FIG. 8A, before forming the pixel defining film 201, a plurality of first electrodes 5 are formed on the base 1. That is, the pixel defining film 201 is formed on the base 1 on which the plurality of first electrodes 5 have been formed. The plurality of first electrodes 5 are spaced apart. The plurality of first electrodes 5 may be arranged in an array, and the plurality of first electrodes 5 may be formed by using a single patterning process. The plurality of first electrodes 5 may be made of indium tin oxide (ITO) or the like.

The pixel defining film 201 covers the plurality of first electrodes 5, and a portion of the pixel defining film 201 may be filled into a gap between any two adjacent first electrodes 5.

For example, the pixel defining film 201 is formed by using a coating process. The pixel defining film is made of a photosensitive material, such as a photoresist.

Figure 8C:
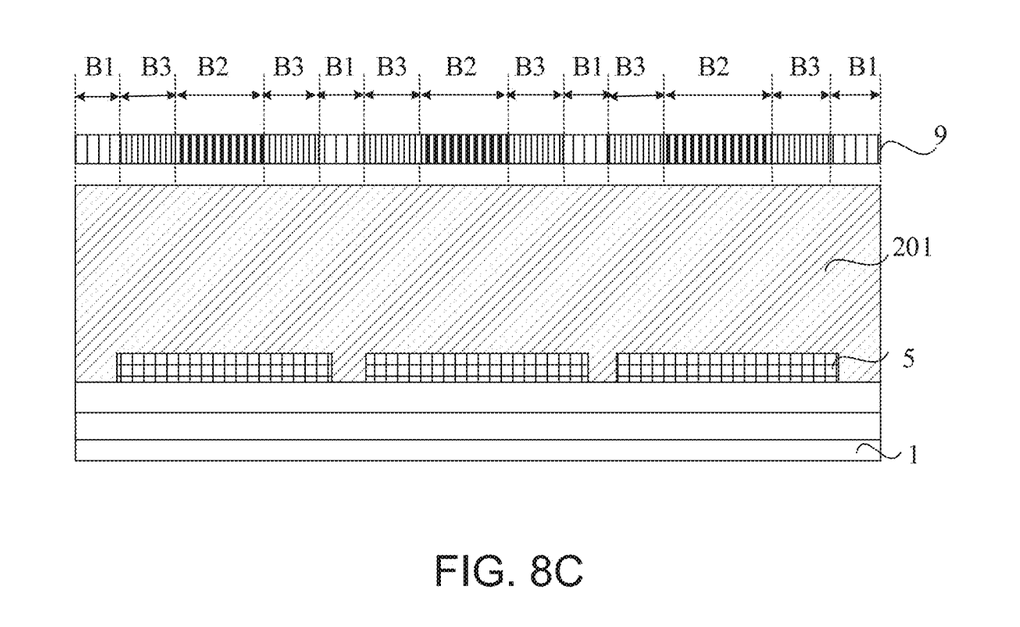
Figure 8D:
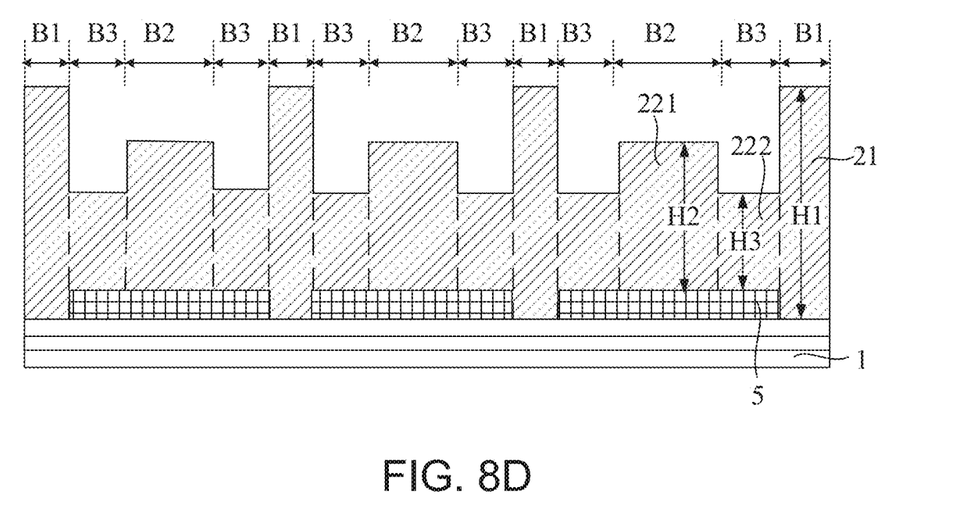

In S200, referring to FIGS. 8C and 8D, the pixel defining film 201 is patterned to form a pixel defining layer 2.

Referring to FIG. 1, the pixel defining layer 2 includes a plurality of defining stripes 21 extending in a first direction Y and a plurality of defining portions 22 extending in a second direction X. Any two adjacent defining strips 21 are provided with second defining portions 22 therebetween, and the defining portions 22 located between the two adjacent defining strips 21 are spaced apart in the first direction Y. The first direction Y and the second direction X intersect. For example, the first direction Y and the second direction X are perpendicular to each other.

The plurality of defining strips 21 and the plurality of defining portions 22 define a plurality of openings 4. Each opening 4 corresponds to one first electrode 5, and at least one portion of the first electrode 5 is exposed by the opening 4. That is, an orthogonal projection of the opening 4 on the base 1 is within an orthogonal projection of the corresponding first electrode 5 on the base 1.

Referring to FIG. 8D, the defining portion 22 includes at least one first sub-portion 221 and at least two second sub-portions 222, and the at least one first sub-portion 221 is connected to two adjacent defining strips 21 through the at least two second sub-portions 222. A thickness H1 of the defining strip 21 is greater than a thickness H2 of the first sub-portion 221, and the thickness H2 of the first sub-portion 221 is greater than a thickness H3 of a second sub-portion 222.

It will be noted that, the structure of the pixel defining layer 2 can be described with reference to the description in the above embodiments/examples, which will not be repeated here.

Figure 8E:
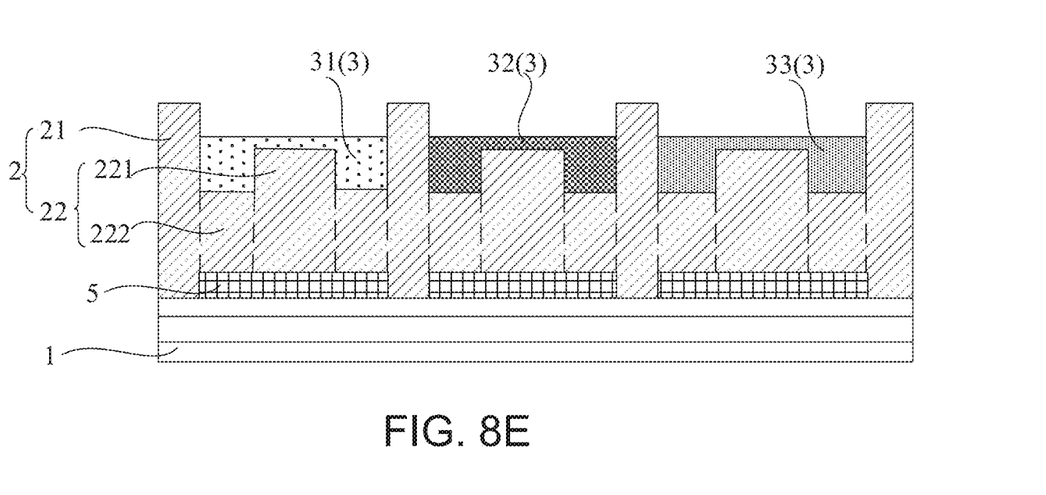

In S300, referring to FIGS. 1 and 8E, a plurality of light-emitting layers 3 are formed on the base 1 on which the pixel defining layer 2 has been formed by using an inkjet printing process.

Referring to FIG. 1, at least one portion of a light-emitting layer 3 is disposed in the corresponding opening 4, and at least two light-emitting layers 3 located between the two adjacent defining strips 21 are connected to form a one-piece structure.

For example, a material of the light-emitting layer is dissolved in an inkjet printing solvent to obtain ink, and by using the inkjet printing process, the ink is dropped to a corresponding opening 4; and then the ink in the corresponding opening 4 is dried in vacuum to obtain the light-emitting layer.

For example, referring to FIG. 1, at least two light-emitting layers 3 in at least two adjacent openings 4 in the first direction Y are made of the same material, and at least two light-emitting layers 3 in at least two adjacent openings 4 in the second direction X are made of different materials.

Beneficial effects of the method for manufacturing the array substrate provided in some embodiments of the present disclosure are the same as the beneficial effects of the array substrate provided in the above embodiments/examples, and will not be repeated here.

In some examples, referring to FIGS. 1 and 4, a light-emitting functional layer 6 is formed in the opening 4.

It will be noted that, a structure of the light-emitting functional layer 6 can be described with reference to the description in the above embodiments/examples, which will not be repeated here.

For example, before the S300, the hole injection layer, the hole transport layer and the electron blocking layer are sequentially formed on the base 1 on which the plurality of first electrodes 5 have been formed; and after the 3300, the hole blocking layer, the electron transport layer and the electron injection layer are sequentially formed on the base 1 on which the plurality of light-emitting layers 3 have been formed.

Figure 8F:
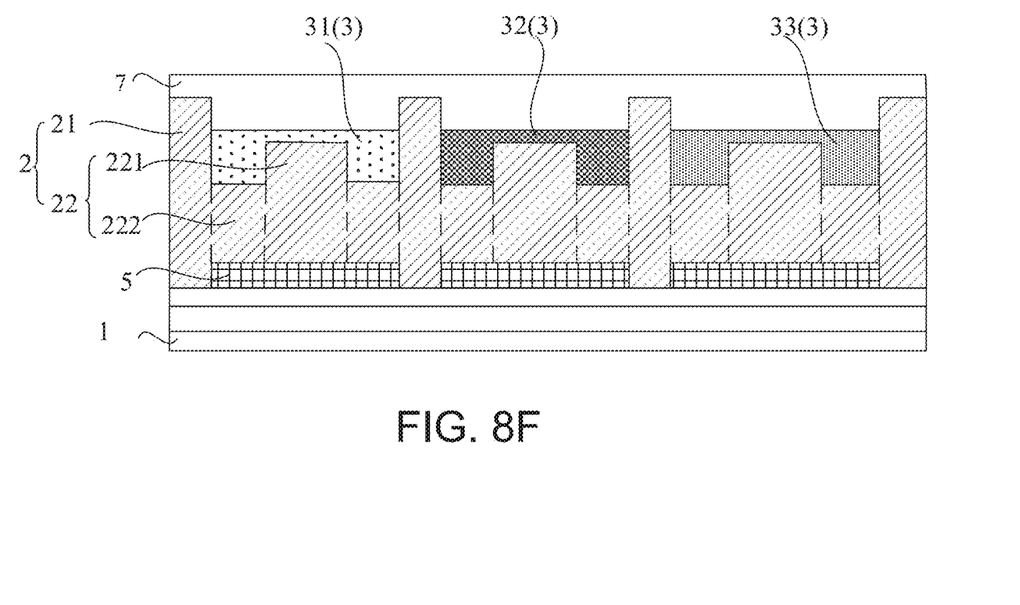

In some examples, as shown in FIG. 8F, the method for manufacturing the array substrate 100 further includes forming a second electrode 7 on the base 1 on which the plurality of light-emitting layers 3 have been formed. The second electrode 7 may cover the pixel defining layer 2. That is, an orthogonal projection of the pixel defining layer 2 is within an orthogonal projection of the second electrode 7.

It will be noted that, a structure of the second electrode 7 can be described with reference to the description in the above embodiments/examples, which will not be repeated here.

Figure 8G:
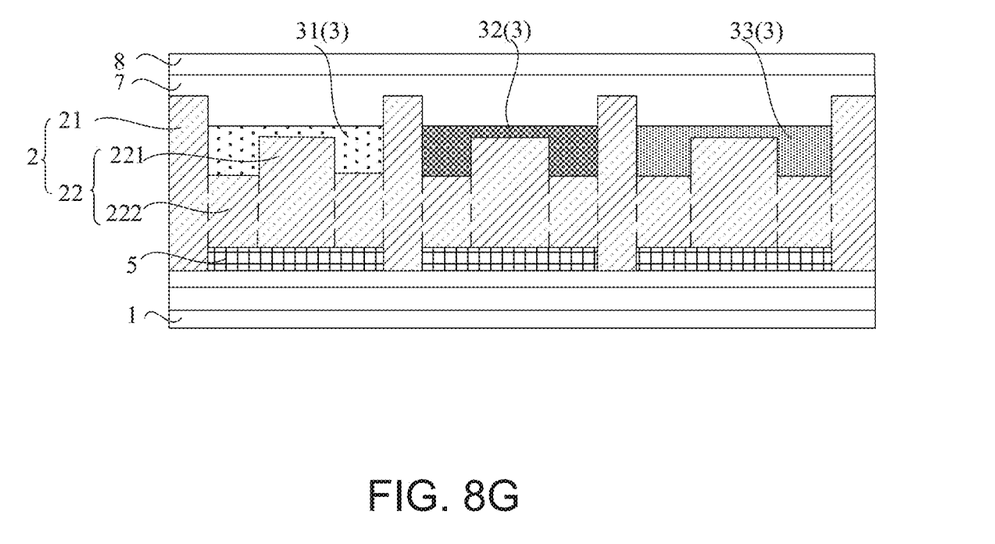

In some examples, as shown in FIG. 8G, the method for manufacturing the array substrate 100 further includes forming an encapsulation layer 8 on a side of the second electrode 7 away from the base 1.

It will be noted that, a structure of the encapsulation layer 8 can be described with reference to the description in the above embodiments/examples, which will not be repeated here.

In some embodiments, as shown in FIG. 8C, in a process of forming the pixel defining layer 2, a mask 9 is provided.

The mask 9 includes first portions B1 corresponding to the defining strips 21 to be formed, second portions B2 corresponding to the first sub-portions 221 to be formed, and third portions B3 corresponding to the second sub-portions 222 to be formed. In a case where the material of the pixel defining film 201 is a positive photoresist, a transmittance of the first portions 31 is 0, that is, the first portions 31 are opaque; a transmittance of the second portions B2 is greater than the transmittance of the first portions B1, a transmittance of the third portions 33 is greater than the transmittance of the second portions B2, and the transmittance of the third portions B3 is less than 100%. In a case where the material of the pixel defining film 201 is a negative photoresist, the transmittance of the first portions B1 is 100%, that is, the first portions B1 are transparent, or the first portions B1 are hollow portions; the transmittance of the second portions B2 is less than the transmittance of the first portions B1, the transmittance of the third portions 33 is less than the transmittance of the second portions 32, and the transmittance of the third portions B3 is greater than 0.

The mask 9 further includes fourth portions corresponding to the openings 4 to be formed. In the case where the material of the pixel defining film 201 is the positive photoresist, a transmittance of the fourth portions may be 100%. That is, the fourth portions are transparent, or the fourth portions are hollow portions. In the case where the material of the pixel defining film 201 is the negative photoresist, the transmittance of the fourth portions may be 0, that is, the fourth portions are opaque.

As shown in FIG. 8C, the mask 9 is aligned with base 1, and then the pixel defining film 201 is exposed. The light for exposing may be irradiated onto the pixel defining film 201 through portions of the mask 9 with the transmittance greater than 0. Since the first portions B the second portions B2, the third portions B3 and the fourth portions (not shown) of the mask 9 have different transmittances, portions of the pixel defining film 201 corresponding to the first portions B1, the second portions B2, the third portions B3 and the fourth portions have different degrees of photosensitivity. Then, as shown in FIG. 8D, the pixel defining film is developed to remove exposed portions of the pixel defining film, and the pixel defining layer 2 is formed.

In the development process, since portions of the pixel defining film 201 are shaded by the first portions B1 of the mask 9, the portions of the pixel defining film 201 shaded by the first portions 31 of the mask 9 are not removed, so as to form the defining strips 21 of the pixel defining layer 2. A portion of the pixel defining film 201 corresponding to each second portion B2 of the mask 9 includes a first exposed portion and a first unexposed portion, the first exposed portion is removed in the development process, and the first unexposed portion is remained to form the first sub-portion 221. A portion of the pixel defining film 201 corresponding to each third portion B3 of the mask 9 includes a second exposed portion and a second unexposed portion, the second exposed portion is removed in the development process, and the second unexposed portion is remained to form the second sub-portion 222. A portion of the pixel defining film 201 corresponding to each fourth portion of the mask 9 is completely removed to form the opening 4.

The mask 9 is used to control the exposure of different portions of the pixel defining film 201 due to different transmittances thereof, so that the defining strip 21, the first sub-portion 221 and the second sub-portion 222 that have different thicknesses are formed. The greater a transmittance of a portion of the mask 9, the smaller a thickness of a corresponding remaining portion in the pixel defining film 201 after development.

It will be noted that, the process of patterning the pixel defining film 201 once is shown in FIGS. 8C to 8D, but the embodiments of the present disclosure is not limited thereto. The patterning of the pixel defining film 201 may be performed by using different masks to form the first sub-portion 221, the second sub-portion 222 and the defining strip 21 in a plurality of times. For example, the first sub-portion is formed by using a first mask, the second sub-portion is formed by using a second mask, and the defining strip is formed by using a third mask.

Figure 9:
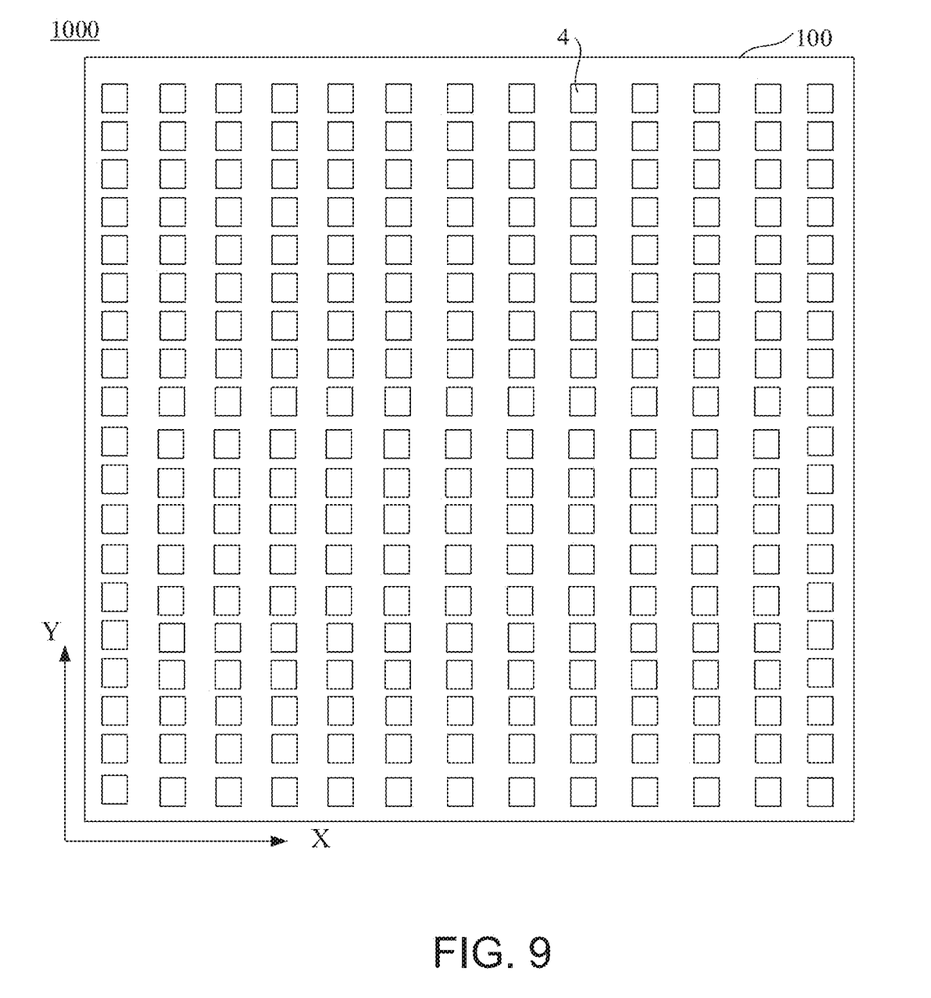
FIG. 9 is a structural diagram of a display panel, in accordance with some embodiments of the present disclosure.

Some embodiments of the present disclosure provide a display panel. As shown in FIG. 9, the display panel 1000 includes the array substrate 100 provided in the above embodiments.

Beneficial effects of the display panel 1000 provided in some embodiments of the present disclosure are the same as the beneficial effects of the array substrate 100 provided in some of the above embodiments, and will not be repeated here.

Figure 10:
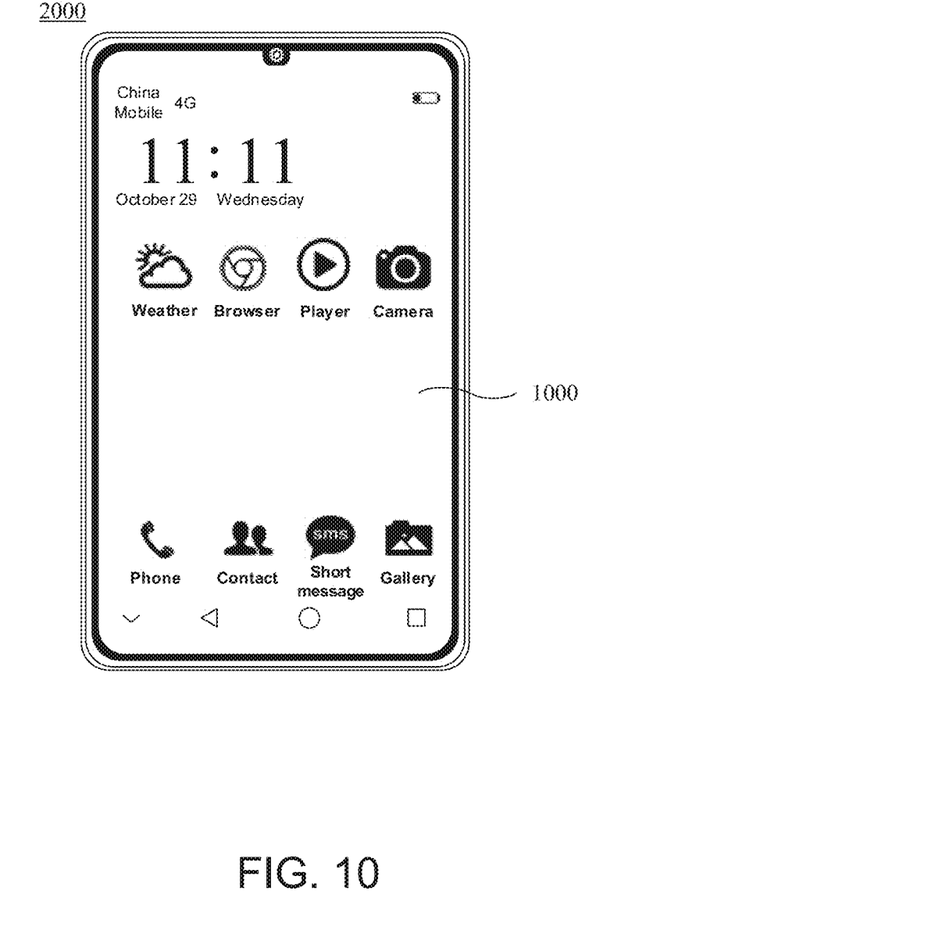
FIG. 10 is a structural diagram of a display device, in accordance with some embodiments of the present disclosure.

Some embodiments of the present disclosure provide a display device. As shown in FIG. 10, the display device 2000 includes the display panel 1000 provided in the above embodiments of the present disclosure.

For example, the display device 2000 further includes a frame, a circuit board, and other electronic accessories. The display panel 1000, the circuit board and the electronic accessories are arranged in the frame.

The display device may be any product or component with a display function, such as a mobile phone, a tablet computer, a television, a monitor, a notebook computer, a digital photo frame or a navigator. Other indispensable components of the display device are presented as understood by those of ordinary skill in the art, and will not be repeated herein, nor should they be used as a limitation to the embodiments of the present disclosure.

Beneficial effects of the display device 2000 provided in some embodiments of the present disclosure are the same as the beneficial effects of the array substrate 100 provided in some of the above embodiments, and will not be repeated here.

The above embodiments of the present disclosure are merely examples to clearly illustrate the present disclosure, and are not limitations on the implementation of the present disclosure. For those of ordinary skill in the art, other changes or variations in different forms may be made on the basis of the foregoing descriptions, and cannot be exhaustively listed herein. Changes or variations derived from the technical solutions of the present disclosure are still within the protection scope of the present disclosure. Therefore, the protection scope of the present disclosure shall be subject to the protection scope of the claims.

What is claimed is:

1. A method for manufacturing an array substrate, comprising:

forming a pixel defining film on a base;

patterning the pixel defining film to form a pixel defining layer, wherein the pixel defining layer includes a plurality of defining strips extending in a first direction and a plurality of defining portions extending in a second direction, the first direction intersecting with the second direction; any two adjacent defining strips are provided with defining portions in the plurality of defining portions therebetween, the defining portions located between the two adjacent defining strips are spaced apart in the first direction, and a defining portion includes at least one first sub-portion and at least two second sub-portions, the at least one first sub-portion is connected to the two adjacent defining strips through the at least two second sub-portions, a thickness of a defining strip is greater than a thickness of a first sub-portion, and the thickness of the first sub-portion is greater than a thickness of a second sub-portion; wherein the defining portion includes one first sub-portion and two second sub-portions, the two second sub-portions are located on two opposite sides of the first sub-portion in the second direction, and a surface of the first sub-portion away from the side of the base is parallel to a plane where the second direction is located; and forming a plurality of light-emitting layers, by using an inkjet printing process, on the base on which the pixel defining layer has been formed, wherein at least one portion of a light-emitting layer is disposed in a corresponding opening, and at least two light-emitting layers located between the two adjacent defining strips are connected to form a one-piece structure.

2. The method according to claim 1, wherein patterning the pixel defining film to form the pixel defining layer, includes:

providing a mask, wherein the mask includes first portions corresponding to the plurality of defining strips to be formed, second portions corresponding to first sub-portions to be formed, and third portions corresponding to second sub-portions to be formed; a transmittance of the first portions is 0, a transmittance of the second portions is greater than the transmittance of the first portions, a transmittance of the third portions is greater than the transmittance of the second portions, and the transmittance of the third portions is less than 100%; or a transmittance of the first portions is 100%, a transmittance of the second portions is less than the transmittance of the first portions, a transmittance of the third portions is less than the transmittance of the second portions, and the transmittance of the third portions is greater than 0;

exposing the pixel defining film by using the mask; and developing the pixel defining film to form the pixel defining layer.

3. The method according to claim 1, further comprising:

forming a plurality of first electrodes on the base before the pixel defining layer is formed; and forming a second electrode on the base on which the plurality of light-emitting layers have been formed.

4. The method according to claim 3, further comprising a plurality of first electrodes disposed on a side, proximate to the base, of the plurality of light emitting layers, wherein an orthogonal projection of an opening on the base is within an orthogonal projection of a corresponding first electrode on the base.

5. The method according to claim 3, further comprising: forming an encapsulation layer on a side of the second electrode away from the base.

6. The method according to claim 1, wherein the thickness of the second sub-portion is in a range from 5% to 10% of the thickness of the first sub-portion.

7. The method according to claim 1, wherein the thickness of the first sub-portion is in a range from 10% to 30% of the thickness of the defining strip.

8. The method according to claim 1, wherein in the second direction, a width of the first sub-portion is greater than a width of the defining strip.

9. The method according to claim 8, wherein in the second direction, the width of the first sub-portion is greater than a width of the second sub-portion.

10. The method according to claim 9, wherein the width of the second sub-portion is in a range from 5% to 10% of the width of the first sub-portion.

11. The method according to claim 8, wherein the width of the defining strip is greater than a width of the second sub-portion.

12. The method according to claim 8, wherein the width of the defining strip is in a range from 10% to 30% of the width of the first sub-portion.

13. The method according to claim 1, wherein all light-emitting layers located between the two adjacent defining strips are connected to form a one-piece structure.

14. The method according to claim 1, wherein the plurality of light-emitting layers are divided into a plurality of groups; and each group includes at least three light-emitting layers sequentially arranged in the second direction, and colors of light emitted by the at least three light-emitting layers are different.

15. The method according to claim 1, further comprising: forming a light-emitting functional layer disposed in the corresponding opening, and the light-emitting functional layer includes at least one of a hole injection layer, a hole transport layer, an electron blocking layer, an electron injection layer, an electron transport layer or a hole blocking layer.

* * * * *

UNITED STATES PATENT AND TRADEMARK OFFICE
CERTIFICATE OF CORRECTION

PATENT NO. : 11,968,859 B2
APPLICATION NO. : 17/501332
DATED : April 23, 2024
INVENTOR(S) : Ying Cui It is certified that error appears in the above-identified patent and that said Letters Patent is hereby corrected as shown below:

In the Claims (1) In Column 16 (Claim 4), Line 12-14, "further comprising a plurality of first electrodes disposed on a side, proximate to the base, of the plurality of light emitting layers," should be deleted.

(2) In Column 16 (Claim 15), Line 53, the word "disposed" in "forming a light-emitting functional layer disposed in the corresponding opening" should be deleted.

Signed and Sealed this
Second Day of July, 2024

Katherine Kelly Vidal
*Director of the United States Patent and Trademark Office*